(12) United States Patent
Stansell et al.

(10) Patent No.: US 7,339,848 B1
(45) Date of Patent: Mar. 4, 2008

(54) ANTI-FUSE LATCH CIRCUIT AND METHOD INCLUDING SELF-TEST

(75) Inventors: Galen Stansell, Kirkland, WA (US); Frederick Jenne, Sunnyvale, CA (US); Igor Kouznetzov, Sunnyvale, CA (US); Ken Fox, Woodinville, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 124 days.

(21) Appl. No.: 11/343,341

(22) Filed: Jan. 30, 2006

Related U.S. Application Data

(60) Provisional application No. 60/733,817, filed on Nov. 3, 2005.

(51) Int. Cl.
*G11C 17/18* (2006.01)

(52) U.S. Cl. ............ 365/225.7; 365/200; 365/201

(58) Field of Classification Search ............ 365/225.7, 365/200, 201
See application file for complete search history.

(56) References Cited

U.S. PATENT DOCUMENTS

| | | | |
|---|---|---|---|
| 5,315,177 A | 5/1994 | Zagar et al. | |
| 5,734,617 A | 3/1998 | Zheng | |
| 5,812,477 A | 9/1998 | Casper et al. | |
| 5,875,144 A | 2/1999 | Zheng | |
| 5,978,298 A | 11/1999 | Zheng | |
| 5,986,932 A | 11/1999 | Ratnakumar et al. | |
| 6,011,742 A | 1/2000 | Zheng | |
| 6,016,264 A | 1/2000 | Lin | |
| 6,084,814 A | 7/2000 | Casper et al. | |
| 6,097,618 A | 8/2000 | Jenne | |
| 6,122,191 A | 9/2000 | Hirose et al. | |
| 6,172,907 B1 | 1/2001 | Jenne | |
| 6,181,627 B1 | 1/2001 | Casper et al. | |
| 6,194,738 B1 * | 2/2001 | Debenham et al. ............ 257/48 |
| 6,246,623 B1 * | 6/2001 | Ingalls ............... 365/225.7 |
| 6,363,011 B1 | 3/2002 | Hirose et al. | |
| 6,373,771 B1 * | 4/2002 | Fifield et al. ............ 365/225.7 |
| 6,420,925 B1 | 7/2002 | Fifield et al. | |
| 6,469,930 B1 | 10/2002 | Murray | |
| 6,553,556 B1 | 4/2003 | Blodgett | |
| 6,556,487 B1 | 4/2003 | Ratnakumar et al. | |
| 6,621,324 B2 | 9/2003 | Fifield et al. | |
| 6,625,080 B2 | 9/2003 | Casper et al. | |
| 6,633,506 B2 | 10/2003 | Casper et al. | |
| 6,741,117 B2 | 5/2004 | Lee | |
| 6,759,895 B2 | 7/2004 | Takami | |
| 7,146,585 B2 | 12/2006 | Blodgett | |
| 7,149,114 B2 | 12/2006 | Taheri et al. | |

* cited by examiner

*Primary Examiner*—Son Dinh
(74) *Attorney, Agent, or Firm*—Haverstock & Owens, LLP

(57) ABSTRACT

A programmable latch circuit (100) can include a programmable data circuit (104) with a data load path (116) that can enable a data value to be recalled into a volatile latch (102). A data load path (116) can be formed with devices (P100-P102) having low threshold voltages. Data can be loaded via data load path at lower power supply voltages levels, such as on power-on and/or reset operations. Other embodiments disclose, self-test circuits, full redundancy capabilities, and resistors for limiting current draw in an anti-fuse program operation.

20 Claims, 8 Drawing Sheets

US 7,339,848 B1

ANTI-FUSE LATCH CIRCUIT AND METHOD INCLUDING SELF-TEST

This application claims the benefit of U.S. Provisional Patent Application Ser. No. 60/733,817, filed Nov. 3, 2005, the contents of which are incorporated by reference herein.

TECHNICAL FIELD

The present invention relates generally to latch circuits and more particularly to latch circuits that can operate in conjunction with anti-fuse elements.

BACKGROUND OF THE INVENTION

Electronics systems can typically include a data storage capability. For example, bi-stable circuits, such as flip-flops can maintain a data value in one of two binary logic values depending upon a stored data value. One commonly used bi-stable circuit that can maintain a logic value until another value is written or rewritten is a latch.

A latch can take a number of different forms. For example, a latch can include cross-coupled inverters that can latch a data value on complementary data nodes until a new data value is rewritten. Such latches are often used as static random access memory (SRAM) cells. An SRAM type latch can store true and complementary logic values. Such stored data values can be read when an execution unit fetches data from an addressed storage cell, as but one example.

While an SRAM type latch can retain stored data without requiring refresh operations (is a "static" store), such a latch will lose a stored data value in the absence of power. However, there are many applications in which it is desirable for a data value to be retained even in the absence of power. Thus, many conventional applications include both a volatile storage circuit and a nonvolatile storage circuit.

While some systems may include nonvolatile storage circuits in an entirely different integrated circuit than volatile storage circuits, there may be instances where both volatile and nonvolatile storage elements are included in the same integrated circuit. In particular, it may be desirable to utilize a storage device having both volatile and nonvolatile features for the same data value. For example, if data is to be temporarily held while power is present, a storage device can utilize a latch into which data can be loaded and thereafter read. However, if the data stored is of sufficient importance, the data could be maintained after power is removed by storing the data value into a nonvolatile storage element. Such a desired storage device could function essentially as a latch, but also include nonvolatile storage for latched data. Such a circuit can be considered a "programmable" latch.

A conventional programmable latch is set forth in FIG. 9 in a schematic diagram and designated by the general reference character 900. A programmable latch 900 can include a volatile latch section 902, a multiplexer section 904, and a nonvolatile storage section 906. A conventional programmable latch 900 can be "one-time" programmable (OTP). That is, the programmable latch 900 can utilize nonvolatile storage elements that can be programmed but once (OTP devices). In the very particular example of FIG. 9, a nonvolatile storage section 906 can include anti-fuse devices 908-0 and 908-1.

To program one data value for the latch (e.g. logic "1"), one anti-fuse device (e.g., 908-1) can be programmed while the other anti-fuse (e.g., 908-0) can remain unprogrammed. To program another data value for the latch (e.g. logic "0"), the states of the anti-fuse devices can be reversed (e.g., 908-1 not programmed and 908-0 programmed).

In the particular example of FIG. 9, a conventional programmable latch 900 can include a program path for anti-fuse device 908-0 formed by n-channel transistors N95 and N93 (to ground) as enabled by transistor N91. Similarly, a program path for anti-fuse device 908-1 can be formed by n-channel transistors N94 and N92 (to ground) as enabled by transistor N90. A particular anti-fuse device (908-0 or 908-1) can be selected for programming according to a data value written into volatile latch section 902 (data latched at nodes D and DB).

Once a data value has been programmed, it can be recalled (i.e., loaded) back into volatile latch section 902. Based on the difference in current draw between the differently programmed anti-fuse devices (908-1 and 908-0), nodes D and DB can be driven to different potentials. The volatile latch section 902 can be configured to latch this programmed data value.

In the particular example of FIG. 9, a conventional programmable latch can include a data load path from anti-fuse device 908-0 formed by n-channel transistors N95 and N97, while a data load path for anti-fuse device 908-1 can be formed by n-channel transistors N94 and N96.

A drawback to the above conventional approach is that data load operations at lower voltages may not be reliably sensed. Lower voltage operations can include power-on reset (POR) operations. In addition, such a conventional programmable latch provides no way of testing anti-fuse devices individually, only testing the overall circuit according to data read and write operations. Still further, during programming operations, when an anti-fuse device is "blown" (changed from non-conductive to conductive) there can be a sudden inrush of current that can damage circuit components.

SUMMARY OF THE INVENTION

The present invention can include a programmable latch circuit that includes at least one anti-fuse device that provides a first impedance in an unprogrammed state and a second impedance in a programmed state, the second impedance being less than the first impedance. In addition, at least one program path can be coupled between a node of a volatile latch circuit and the at least one anti-fuse device. The program path can be enabled in a program operation that establishes a state of the anti-fuse device. The programmable latch circuit can also include at least one data load path coupled between the node of the volatile latch circuit and the anti-fuse device in parallel with the program path. The data load path can comprise a source-drain path of at least one p-channel insulated gate field effect transistor (IGFET).

According to one aspect of the embodiments, a programmable latch circuit can further include a resistor formed in the same substrate as the anti-fuse device coupled between the anti-fuse device and a program voltage node.

According to another aspect of the embodiments, a programmable latch circuit can include at least a first primary anti-fuse device and a first redundant anti-fuse device. In addition, at least one program path can include a first primary program path coupled between a first node of the volatile latch circuit and the first primary anti-fuse device, and a first redundant program path coupled between the first node of the volatile latch circuit and the first redundant anti-fuse device. At least one data load path can include a first primary data load path coupled between the first node of the volatile latch circuit and the first primary anti-fuse device, and a first redundant data load path coupled between the first node of the volatile latch circuit and the first redundant anti-fuse device.

According to another aspect of the embodiments, a programmable latch circuit can further include a second primary anti-fuse device and a second redundant anti-fuse device. At least one program path can further include a second primary program path coupled between a second node of the volatile latch circuit and the second primary anti-fuse device, and a second redundant program path coupled between the second node of the volatile latch circuit and the second redundant anti-fuse device. At least one data load path can further include a second primary data load path coupled between the second node of the volatile latch circuit and the second primary anti-fuse device, and a second redundant data load path coupled between the second node of the volatile latch circuit and the second redundant anti-fuse device.

According to another aspect of the embodiments, at least one data load path consists of one p-channel IGFET or a plurality of p-channel IGFETs having source-drain paths arranged in series between the node of the volatile latch circuit and the anti-fuse device.

According to another aspect of the embodiments, at least one program path can consist of one n-channel IGFET or a plurality of n-channel IGFETs having source-drain paths arranged in series between the node of the volatile latch circuit and the anti-fuse device.

According to another aspect of the embodiments, a programmable latch circuit can further include at least one program path coupled to a first node of the volatile latch circuit, and at least one data load path is coupled to the first node of the volatile latch. In addition, an anti-fuse test circuit can be coupled between the node of the volatile latch and a power supply node. The anti-fuse test circuit can include a current supply arranged in series with a controllable impedance path.

According to another aspect of the embodiments, a current supply can comprise an IGFET that receives a bias voltage at its gate. The bias voltage can vary between a high power supply level and a low power supply level.

The present invention can also include a programmable latch circuit having a volatile latch circuit comprising a pair of latch transistors cross-coupled between a first data node and a second data node and formed in an integrated circuit substrate. At least one anti-fuse structure can be coupled to at least one of the data nodes. A self-test circuit can be formed in the integrated circuit substrate including a first self-test section coupled to at least one of the data nodes. The self-test circuit can include a first current source circuit and a first switch device arranged in series. The first switch device can provide a low impedance in a test mode and a high impedance in a non-test mode.

According to another aspect of the embodiments, a programmable latch circuit can include a first primary anti-fuse structure coupled to the first data node and a second primary anti-fuse structure coupled to the second data node. A self-test circuit can further include a first self-test section coupled the first data node and the first switch device providing the low impedance in a first test mode. In addition, a second self-test circuit can be coupled to the second data node that includes a second current source circuit and a second switch device arranged in series. The second switch device can provide a low impedance in a second test mode and a high impedance in the non-test mode.

According to another aspect of the embodiments, a programmable latch circuit can include a first primary anti-fuse structure and a first redundant anti-fuse structure coupled to a first data node of the volatile latch circuit, and a second primary anti-fuse structure and a second redundant anti-fuse structure coupled to a second data node of the volatile latch circuit.

According to another aspect of the embodiments, a programmable latch circuit can include at least a first primary anti-fuse structure coupled between the first data node and a high power supply node. In addition, a self-test circuit can include a first self-test section coupled between a second data node and the high power supply node. A first switch device can be a p-channel insulated gate field effect transistor.

According to another aspect of the embodiments, a programmable latch circuit can further include a second primary anti-fuse structure coupled between the second data node and the high power supply node. A self-test circuit can further include a second self-test section coupled between the first data node and the high power supply node that includes a second current source circuit and a second switch device arranged in series. The second switch device can comprise a p-channel insulated gate field effect transistor that provides a low impedance in a test mode and a high impedance in a non-test mode.

According to another aspect of the embodiments, at least a first resistor can be formed in the integrated circuit substrate and coupled between the at least one anti-fuse structure and a first power supply node.

According to another aspect of the embodiments, a programmable latch circuit can further include a pair of latch transistors having sources coupled to a low power supply voltage. In addition, at least a first data path can comprise a first data program path and a first data load path. A first data program path can be coupled between at least one anti-fuse structure and at least one data node, and can be enabled to program the first primary anti-fuse structure into a low impedance state. A first data load path can be coupled between at least one anti-fuse structure and at least one data node, and can be enabled to read a state of the first primary anti-fuse structure.

According to another aspect of the embodiments, load transistors can be selected from the group consisting of p-channel insulated gate field effect transistors (IGFETs) and native n-channel IGFETs having threshold voltages with an absolute value no greater than 200 mV.

The present invention can also include a method of programmable latching. The method can include programming at least one anti-fuse device into a predetermined state by applying a programming voltage to a program path coupled to the anti-fuse device, and loading a data value into a volatile latch circuit by enabling a data load path, different from the program path and coupled between the at least one anti-fuse device and the volatile latch circuit. The data value can be determined by the state of the at least one anti-fuse device.

According to one aspect of the embodiments, enabling the data path includes enabling a p-channel insulated gate field effect transistor or a plurality of p-channel insulated gate field transistors having source-drain paths that form at least a portion of the data path.

According to another aspect of the embodiments, a method can further include providing a resistor, formed in the same integrated circuit as the volatile latch circuit, between at least one anti-fuse device and a programming power supply node. In addition, the method can include, in a test mode, latching a data value in the volatile latch circuit based on a comparison between a current drawn by at least one anti-fuse device and a current drawn by a current source circuit formed in the same substrate as the volatile latch circuit.

According to another aspect of the embodiments, a method can further include providing first and second anti-fuse devices in parallel between a first node of the volatile latch circuit and a programming voltage node, and providing third and fourth anti-fuse devices in parallel between a second node of the volatile latch circuit and the programming voltage node. The method can further include providing both a programming path and data load path between each anti-fuse device and the node of the volatile latch to which the anti-fuse device is coupled, programming the second anti-fuse device if a programming of the first anti-fuse is not successful, and programming the fourth anti-fuse device if a programming of the third anti-fuse is not successful.

DETAILED DESCRIPTION

Various particular embodiments of the present invention are set forth below in a number of diagrams. The embodiments include programmable latch circuits and related methods.

Figure 1:
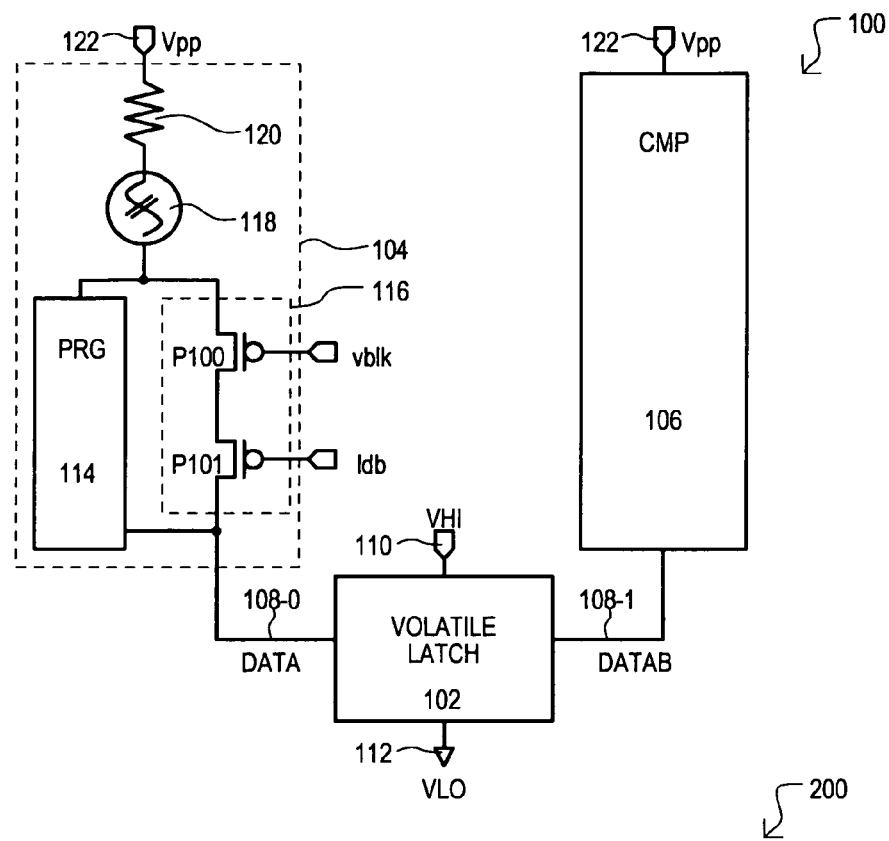
FIG. 1 is a block schematic diagram of a programmable latch circuit according to a first embodiment of the present invention.

Referring now to FIG. 1, a programmable latch circuit according to a first embodiment is set forth in a block schematic diagram and designated by the general reference character 100. The programmable latch circuit 100 can include a volatile latch 102, a programmable data circuit 104, and a comparative data circuit 106. A volatile latch 102 can provide a latched data value on complementary data nodes (108-0 and 108-1) as long as power is provided between a high power supply node 110 and a low power supply node 112.

A programmable data circuit 104 can enable a predetermined data value to be recalled (e.g., loaded) into volatile latch 102. In the embodiment of FIG. 1, a programmable data circuit 104 can include a programming path 114, a data load path 116, an anti-fuse device 118, and a resistor 120. In this particular description, an anti-fuse device 118 can have either an unprogrammed state or a programmed state. In an unprogrammed state, an anti-fuse device 118 can present a high impedance (e.g., draw little, if any current). In a programmed state, an anti-fuse device 118 can present a lower impedance than in the programmed state (draw some predetermined current).

A programming path 114 can provide a path by which an anti-fuse device 118 can be "programmed" into the programmed state by application of a predetermined potential. In the arrangement of FIG. 1, a programming path 114 can establish a potential across anti-fuse device 118 with respect to a programming voltage node 122.

A data load path 116 can provide a path to load a data value, established by a state of anti-fuse device 118, into a volatile latch 102. A data load path 116 can provide a path between a data node 108-0 and a program voltage node 122 that can result in data node 108-0 being driven to a particular potential with respect to the other data node 108-1. Such a difference in potential can then be latched within volatile latch 102. A data load path 116 can include the source-drain path of one or more p-channel insulated gate field effect transistors (IGFETs).

In the particular example of FIG. 1, a data load path 116 can include two p-channel transistors P100 and P101. A transistor P100 can receive a signal vblk at its gate while transistor P101 can receive a signal ldb at its gate. Such signals can ensure that transistors P100 and P101 are on (e.g., provide a relatively low impedance) in a load operation, and are off (e.g., provide a relatively high impedance) in other operations, such as program, read and/or write.

Forming a data load path 116 from p-channel transistors can allow a load path to be enabled (provide a low impedance) even when a power supply voltage is at a relatively low level. More particularly, in a load operation a program voltage node 122 can receive a power supply voltage (VHI). In a power-on and/or reset operation, such a voltage may be less than a nominal level. By including only p-channel transistors, a data load path 116 does not introduce any threshold voltage drop, as would be the case of a typical enhancement mode n-channel transistor. Thus, a programmed anti-fuse device 118 can charge a data node 108-0 sooner and/or at a lower potential than a conventional path formed from n-channel enhancement mode devices.

It is noted that an alternate embodiment can include different types of "low" threshold voltage devices to allow for loading of data at low power supply voltages. As but one example, a data load path 116 could be formed in part, or in whole, by "native" n-channel transistors, which can have a threshold voltage of about 0 volts, more particularly in the general range of about −150 mV to +150 mV.

A resistor 120 can be provided between anti-fuse device 118 and a programming power supply voltage 122. A resistor 120 can limit the amount of current drawn once anti-fuse device 118 is programmed. In particular, an anti-fuse device 118 can be a gate-oxide anti-fuse (GOAF) device that is programmed by overstressing a gate oxide to create a polysilicon short between a substrate and gate structure. Thus, in a programming operation, a GOAF may draw little if any current leading up to the programming event. However, once the gate oxide is ruptured (is "blown") current can be suddenly drawn, and can overstress other circuit components within the programmable latch circuit. A resistor 120 can limit the current drawn, thus providing overstress protection in a programming operation.

Preferably, a resistor 120 is formed in the same integrated circuit substrate as the other circuit components of programmable latch circuit 100.

Referring still to FIG. 1, a comparative data circuit 106 can provide a comparative data value at node 108-1 that can enable a data value at node 108-0 to be latched within volatile latch 102. As but one example, in a load operation, if anti-fuse device 118 is programmed, it can draw a particular current Iprog. A comparative data circuit 106 can draw a smaller current to enable the generation of a differential voltage across nodes 108-0 and 108-1 that can be latched by volatile latch 102. Conversely, in a load operation, if anti-fuse device 118 is not programmed, it can draw a very small current Iintact. A comparative data circuit 106 can draw a larger current to enable the generation of an opposite polarity differential voltage across nodes 108-0 and 108-1 that can be latched by volatile latch 102.

In very particular embodiments, a comparative data circuit 106 can have the same structure as programmable data circuit 104, and can include an anti-fuse device programmed in an opposite fashion to anti-fuse device 118. However, in alternate embodiments, a comparator data circuit 106 can be a current source or the like, calibrated to draw a current that is less than that drawn by a programmed anti-fuse device, but greater than that drawn by an unprogrammed anti-fuse device.

In this way, a programmable latch circuit can include a low voltage enabled data load path and/or a program current protection resistor.

Figure 2:
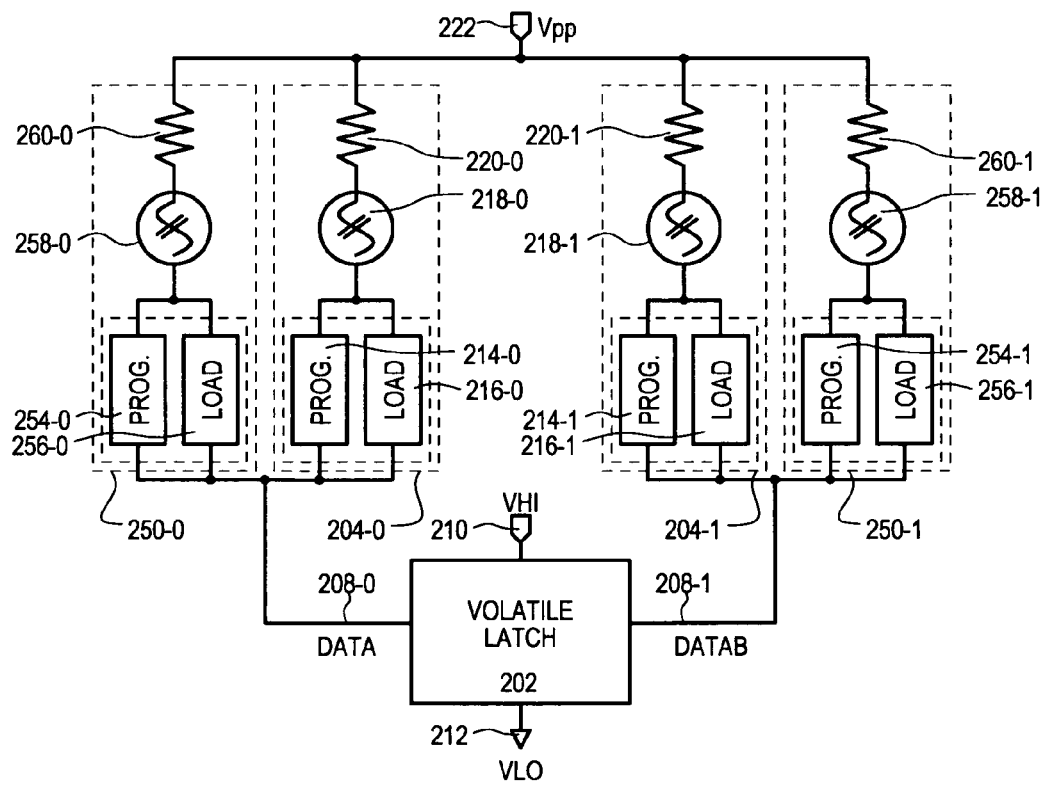
FIG. 2 is a block schematic diagram of a programmable latch circuit according to a second embodiment of the present invention.

FIG. 2 is a block schematic diagram of a second embodiment of the present invention. A second embodiment 200 can include a volatile latch circuit 202, a first primary programmable data circuit 204-0 and a second primary programmable data circuit 204-1. In addition, a programmable latch circuit 200 can also include a first redundant programmable data circuit 250-0 and a second redundant programmable data circuit 250-1.

In the very particular arrangement of FIG. 2, each programmable data circuit (204-0, 204-1, 250-0 and 250-1) can include a program path (214-0, 214-1, 254-0 and 2541), a data load path (216-0, 216-1, 256-0 and 256-1), an anti-fuse device (218-0, 218-1, 258-0 and 258-1), and a resistor (220-0, 220-1, 260-0 and 260-1). A program path (2140/1, 2540/1) can provide a low impedance in a program operation, and a high impedance in other operations (load, read and/or write). A data load path (216-0/1, 256-0/1) can provide a low impedance in a data load operation, and a high impedance in other operations (program, read and/or write).

Each anti-fuse device (218-0/1, 258-0/1) can be electrically connected to a program power supply voltage 222 by respective resistors (220-0/1, 260-0/1). Resistors (220-0/1, 260-0/1) are preferably integrated with other circuit components of the programmable latch 200.

First primary programmable data circuit 204-0 can be electrically connected between a program power supply node 222 and a first node 208-0 of a volatile latch 202. Second primary programmable data circuit 204-1 can be electrically connected between a program power supply node 222 and a second node 208-1 of a volatile latch 202.

A programmable latch circuit 200 can have "full" redundancy by including a first redundant programmable data circuit 250-0 in parallel with first primary programmable data circuit 2040 between a program power supply node 222 and a first node 208-0 of a volatile latch 202. In addition, second redundant programmable data circuit 250-1 can be arranged in parallel with second primary programmable data circuit 204-1 between a program power supply node 222 and a second node 208-1 of a volatile latch 202.

In such an arrangement, if a programming operation for anti-fuse device 218-0 fails, anti-fuse device 258-0 can be programmed in its place. Similarly, if a programming operation for anti-fuse device 218-1 fails, anti-fuse device 258-1 can be programmed in its place.

In this way, a programmable latch circuit 200 can have full redundancy by providing two or more anti-fuse devices electrically connected in parallel with main (e.g., non-redundant) anti-fuse devices to each node of a volatile latch circuit.

Figure 3:
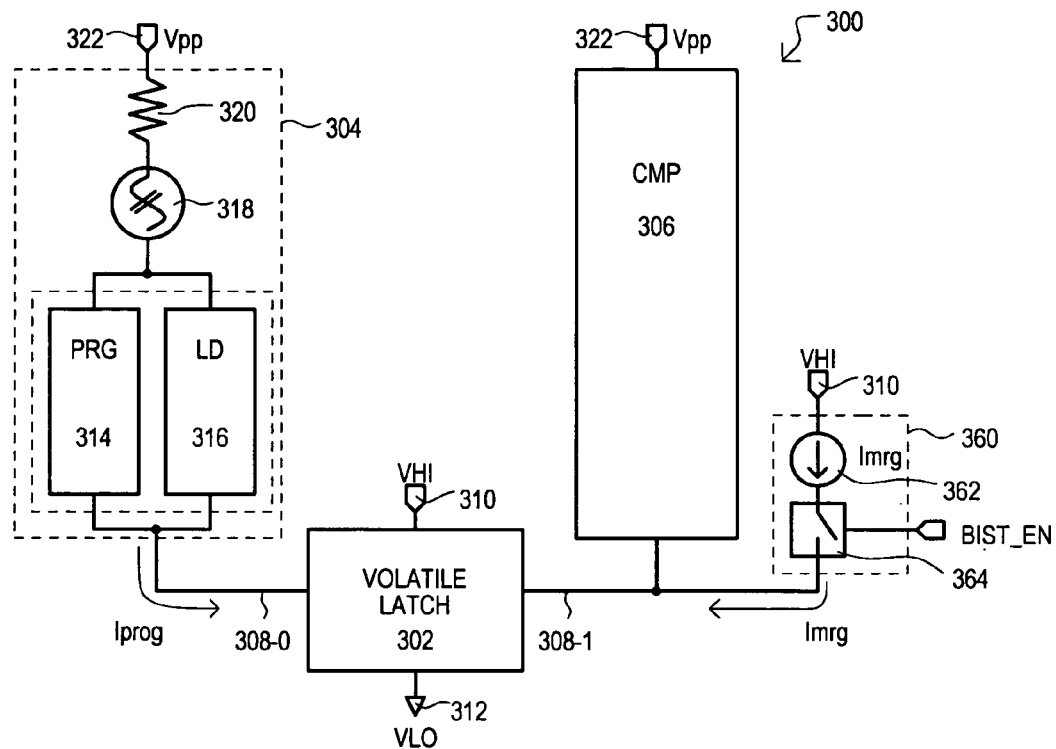
FIG. 3 is a block schematic diagram of a programmable latch circuit according to a third embodiment of the present invention.

Referring now to FIG. 3, a programmable latch circuit according to a third embodiment is set forth in a block schematic diagram and designated by the general reference character 300. Programmable latch circuit 300 can include a volatile latch 302, a programmable data circuit 304, a comparative data circuit 306, and a built-in self-test (BIST) circuit 360.

A programmable data circuit 304 may take the form of programmable data circuits shown in the disclosed embodiments, and can include a program path 314 and a data load path 316. Similarly, a comparative data circuit 306 can take the form of various comparative data circuits discussed above in the disclosed embodiments.

A BIST circuit 360 can be formed in the same integrated circuit substrate as other circuit components of the programmable latch circuit 300. A BIST circuit 360 can generate a current Imrg that can be utilized to determine if an anti-fuse device has been adequately programmed. In the very particular example of FIG. 3, BIST circuit 360 can be electrically connected between node 308-1 and a high power supply node 310, and can test anti-fuse device 318 electrically connected to complementary node 308-0. A BIST circuit 360 can include a current source 362 and a switch device 364 arranged in series. When switch device 364 is on (provides an electrical path), current source 362 can provide test current Imrg to node 308-1.

In a test operation, a volatile latch 302 can be placed in a pre-condition state that presents an equal voltage at nodes 308-0 and 308-1. Data load path 316 can be enabled, resulting in anti-fuse device 318 (which is assumed to have been previously subject to a program operation) being electrically connected to node 308-0 and current Iprog flowing to volatile latch 302. A program voltage node 322 can be at a high power supply level (VHI) (as opposed to a program voltage). At the same time, BIST circuit 360 can be enabled, causing current Imrg to flow to node 308-1. After some predetermined time, volatile latch 302 can be enabled.

If anti-fuse device 318 is operating in an acceptable fashion, node 308-0 can be drawn higher than node 308-1 and volatile latch 302 can latch a first value indicating acceptable operation. However, if anti-fuse device 318 is defective, current Iprog will be too small, and node 308-1 can be drawn higher than node 308-0 by operation of test current Imrg, and volatile latch 302 can latch a second value indicating an unacceptable operation.

In this way, a programmable latch device can be tested quickly, and with built-in circuitry.

Figure 4:
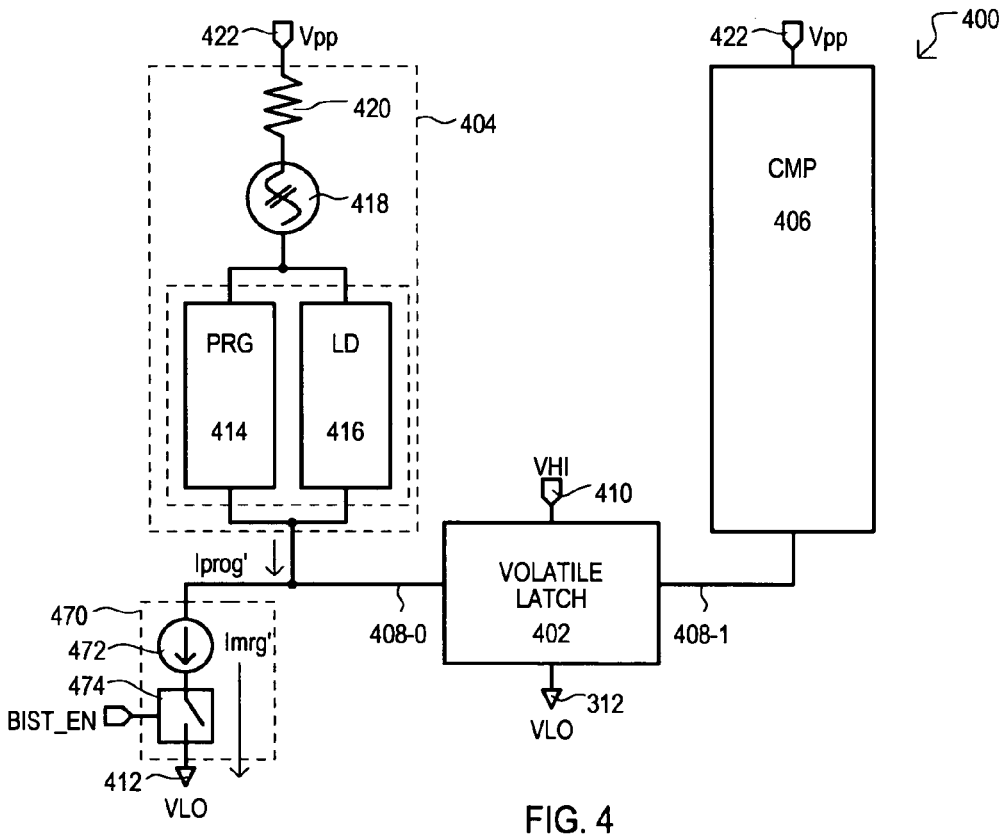
FIG. 4 is a block schematic diagram of a programmable latch circuit according to a fourth embodiment of the present invention.

Referring now to FIG. 4, a programmable latch circuit according to a fourth embodiment is set forth in a block schematic diagram and designated by the general reference character 400. Programmable latch circuit 400 can include many of the same circuit sections as FIG. 3. Accordingly, like sections are referred to by the same reference character but with the first digit being a "4" instead of a "3".

One way in which the embodiment of FIG. 4 can differ from that of FIG. 3 is that a BIST circuit 370 can be electrically connected to a same node 408-0 as a tested anti-fuse device 418.

In a test operation, a volatile latch 402 can first be placed in a pre-conditioned state, as described above in conjunction with FIG. 3. Data load path 416 can then be enabled, resulting in anti-fuse device 418 being electrically connected to node 408-0 and current lprog' flowing to volatile latch 402. At the same time, BIST circuit 470 can be enabled and provide a current sink that can draw a test current lmrg'. After some predetermined time, volatile latch 402 can be enabled.

If anti-fuse device 418 is operating in an acceptable fashion, node 408-0 can be drawn higher than node 408-1, as anti-fuse device 418 can source more current than BIST circuit 470 can sink. However, if anti-fuse device 418 is defective, current lprog' will be too small, and node 408-0 can be drawn lower than node 408-1, as BIST circuit 470 can sink more current than ant-fuse device 418 can source.

Figure 5:
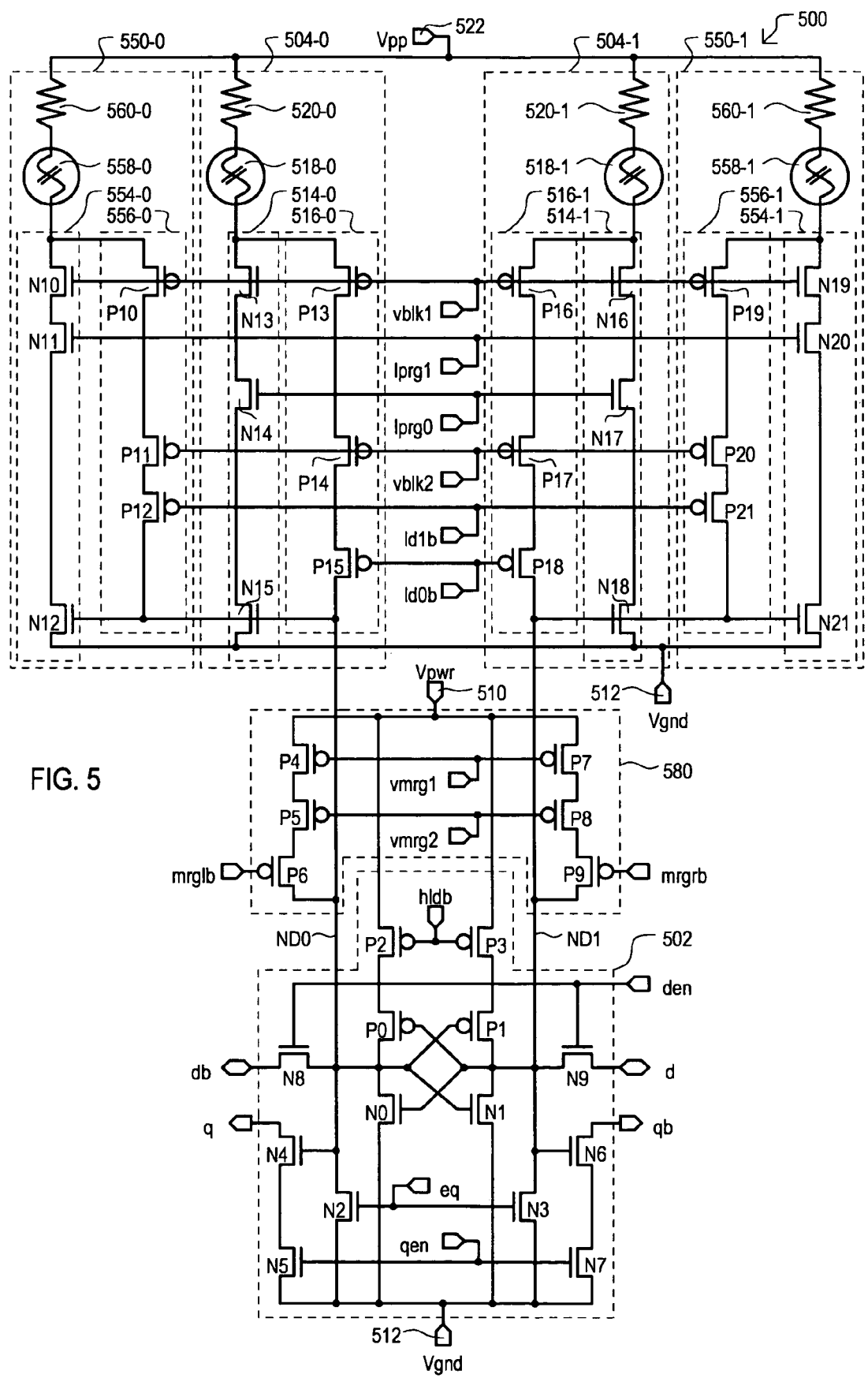
FIG. 5 is a schematic diagram of a programmable latch circuit according to a fifth embodiment of the present invention.

Referring now to FIG. 5, a programmable latch circuit 500 according to a fifth embodiment of the present invention is set forth in a detailed schematic diagram. A programmable latch circuit 500 can include a volatile latch 502, main programmable data circuits 5040 and 504-1, redundant programmable data circuits 550-0 and 550-1, and a BIST circuit 580.

A programmable latch circuit 500 can be formed with circuit components commonly formed in an integrated circuit substrate. The particular implementation of FIG. 5 can include complementary insulated gate field effect transistors (IGFETs), referred to hereinafter as MOS transistors, though this is not meant to indicate any particular gate, gate insulator, or substrate material.

A volatile latch 502 can include n-channel MOS (NMOS) transistors N0/N1 and p-channel MOS (PMOS) transistors P0/P1 cross-coupled between data nodes ND0 and ND1.

Within volatile latch 502, circuitry for "read only" operations can be formed by NMOS transistors N2-N7. Transistor N2 and N3 can have source-drain paths coupled between data nodes ND0 and ND1, respectively, and a low power supply node 512, and have gates that receive an equalization signal eq. A data value q can be read by operation of transistors N4 and N5. Transistors N4 and N5 can have source-drain paths arranged in series between an output node for q and low power supply node 512. A gate of transistor N4 can be connected to node ND0 and a gate of transistor N5 can receive a read only signal qen. A data value qb can be read by operation of transistors N6 and N7. Transistors N6 and N7 can have source-drain paths arranged in series between an output node for qb and low power supply node 512, with a gate of transistor N6 being connected to node ND1 and a gate of transistor N7 receiving signal qen.

A volatile latch 502 can also include enable circuits formed by PMOS transistors P2 and P3. Transistors P2 and P3 can have source-drain paths connected between node ND0 and ND1, respectively, and a high power supply node 510, and gates that receive an enable signal hldb. When enabled (placed into a low impedance state), transistors P0 and P1 can enable a data latching function of volatile latch 502. When disabled (in a high impedance), transistors P0 and P1 can disable a latching function of volatile latch 502.

In the particular arrangement of FIG. 5, main and redundant programmable data circuits (5040, 504-1, 550-0, 550-1) can have the same general construction. Accordingly, only programmable data circuit 504-0 will be described in detail.

Programmable data circuit 504-0 can include a program path 514-0 and a data load path 516-0. A program path 5140 can include NMOS transistors N13-N15 having source-drain paths arranged in series between an anti-fuse device 518-0 and a low power supply node 512. Transistor N13 can receive a blocking signal vblk1 at its gate that can place transistor N13 in a low impedance state in a program operation and in a high impedance state in other operations (i.e., read, write, load). Signal vbik1 can also enable a high programming voltage to be applied across anti-fuse device 518-0. Transistor N14 can receive a main program signal lprg0 at its gate that can place transistor N14 in a low impedance state in a program operation and in a high impedance state in other operations (i.e., read, write, load). Transistor N15 can have a gate connected to a data node ND0.

In such an arrangement, when signals lprg0 and vblk1 are active, and the corresponding data node ND0 is latched at a high level, a low impedance path can be created between anti-fuse device 518-0 and low power supply node 512.

A data load path 516-0 can include PMOS transistors P13-P15 having source-drain paths arranged in series between anti-fuse device 518-0 and corresponding data node ND0. Transistor P13 can receive blocking signal vblk1 at its gate that can place transistor P13 in a low impedance state in a data load operation and in a high impedance state in other operations (i.e., read, write, program). Transistor P14 can receive a blocking signal vblk2 at its gate that can place transistor P14 in a low impedance state in a data load operation and in a high impedance state in other operations (i.e., read, write, program). Transistor N15 can have a gate connected to a load signal ld0b that can place transistor P15 in a low impedance state in a data load operation and in a high impedance state in other operations (i.e., read, write, program).

It is noted that transistors P13-P15 can be PMOS devices, and so can provide a data load path 516-0 that can be enabled at low power supply voltages, as noted above in conjunction with FIG. 1. Thus, data load operations can be more reliable in low power supply events, such as during a power-on operation (power first applied to circuit) and/or a reset operation (power temporarily interrupted), as also discussed above with reference to FIG. 1.

Of course, as in the case of FIG. 1, in other embodiments, a data load path could include other types of transistors, such as native NMOS devices, or the like.

A resistor 520-0 and anti-fuse device 518-0 can be connected in series between a program power supply node 522 and program path 514-0 and data load path 516-0.

It is noted that program paths 554-0 and 554-1 within redundant programmable data circuits (554-0 and 554-1) can have NMOS transistors N11 and N20 that receive a separate redundant program signal lprg1 instead of signal lprg0. This can enable separate program operations between redundant anti-fuse devices 558-0/1 and main anti-fuse devices 518-0/1. Further, while main and redundant programmable data circuits (504-0 and 550-0) can be connected to node ND0, main and redundant programmable data circuits (504-1 and 550-1) can be connected to complementary node ND1.

In the arrangement of FIG. 5, redundant programmable data circuit 550-0 can provide redundancy with respect to primary programmable data circuit 504-0. Thus, if anti-fuse device 518-0 cannot be adequately programmed, anti-fuse device 558-0 can be programmed in its place. Similarly, redundant programmable data circuit 550-1 can provide redundancy with respect to redundant programmable data circuit 504-1.

Referring still to FIG. 5, a BIST circuit 580 can include PMOS transistors P4-P6 for testing anti-fuse devices 518-1 and/or 558-1, and PMOS transistors P7-P9 for testing anti-fuse devices 518-0 and/or 558-0. Transistors P4-P6 can have source-drain paths arranged in series between a high power supply node 510 and data node ND0. In a similar fashion, transistors P7-P9 can have source-drain paths arranged in series between a high power supply node 510 and data node ND1. Transistors P4 and P7 can receive a bias voltage vmrg1 and transistors P5 and P8 can receive a bias voltage vmrg2. Transistors P6 and P9 can receive test enable signals mrglb and mrgrb, respectively. Bias voltages vmrg1 and vmrg2 can be set to a level to "margin" test a programmed anti-fuse device. That is, such bias voltages can be set so that a current drawn by transistors P4-P6 (when P6 is enabled by signal mrglb), or a current drawn by transistors P7-P9 (when P9 is enabled by signal mrgrb), is at a predetermined minimum level. In one very particular approach, such a minimum level can be the smallest amount of current that a properly programmed anti-fuse device is expected to draw at a data node (ND0 and ND1) plus some additional margin.

Figure 6A:
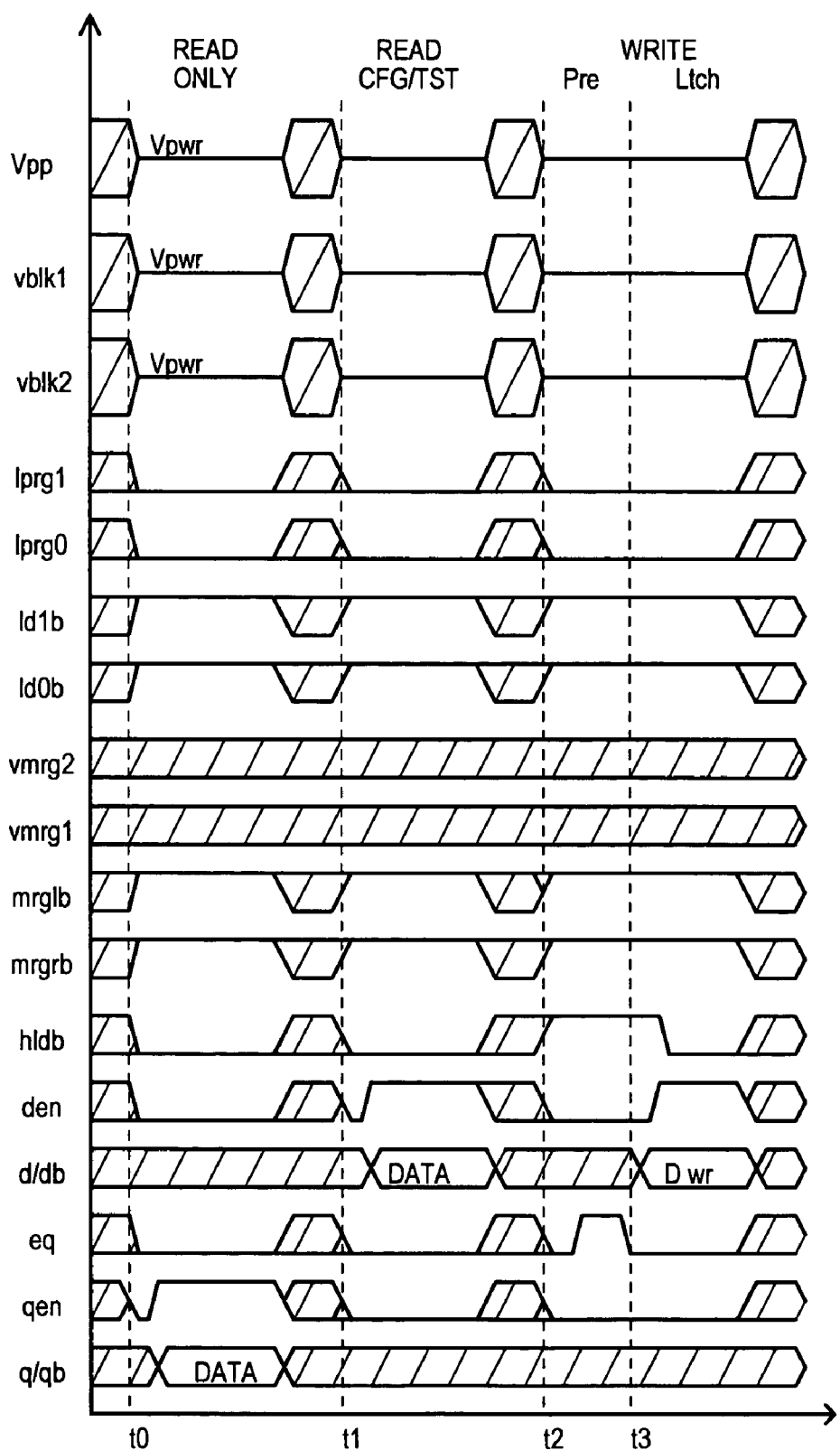
FIGS. 6A and 6B are timing diagrams showing various operations of the programmable latch circuit of FIG. 5.
Figure 6B:
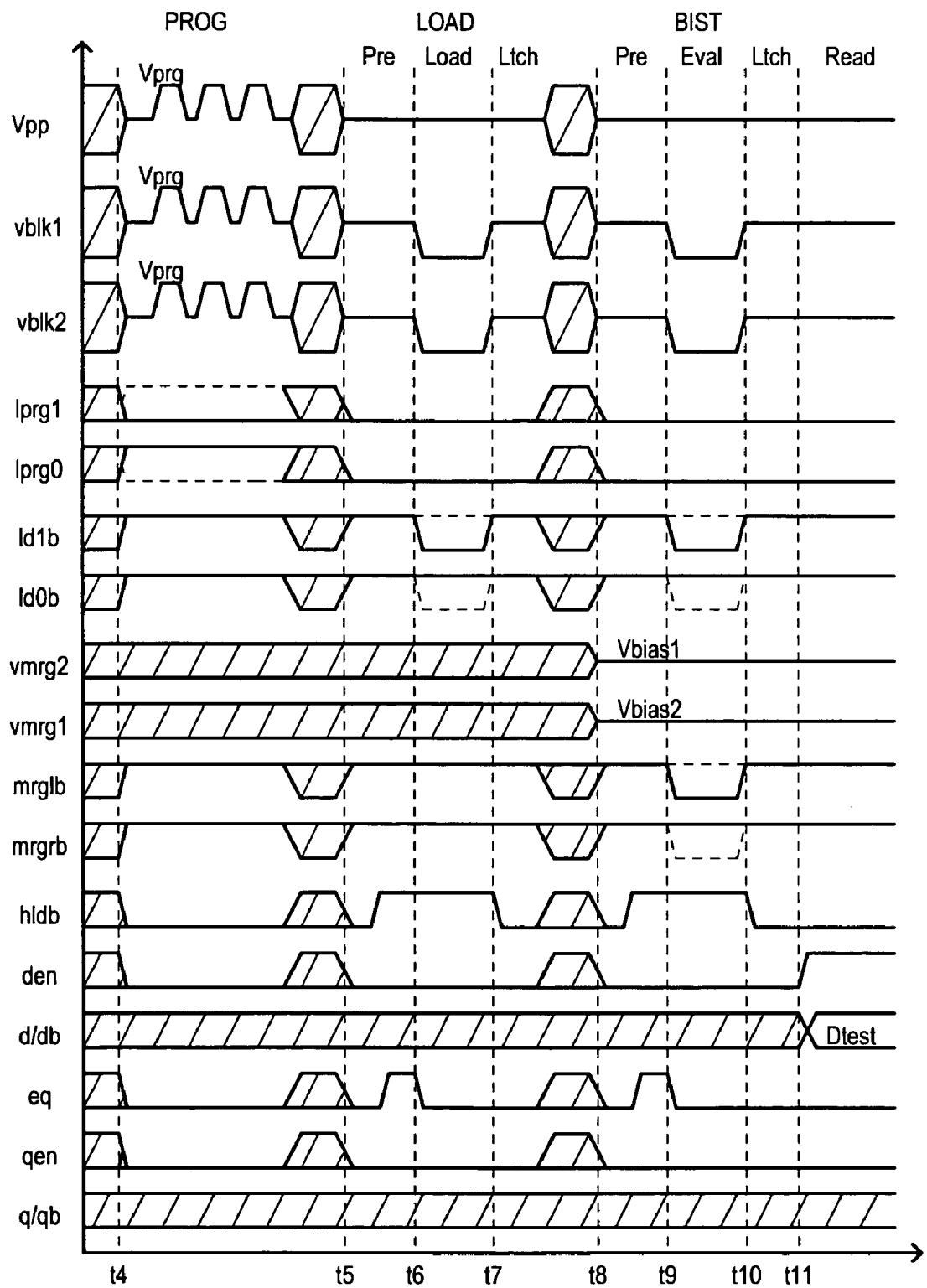

Having described the general construction of a programmable latch circuit 500 shown in FIG. 5, the operation of such a circuit will now be described with reference to timing diagrams shown in FIGS. 6A and 6B. FIGS. 6A and 6B show examples of six programmable latch operations: a read only operation, a read operation for configuration and test, a write operation, a program operation, a load operation, and a BIST operation. FIGS. 6A and 6B include waveforms for a program voltage Vpp, bias voltages vmrg1 and vrmg2, and signals vblk1, vblk2, lprg1, lprg0, ld1*b*, ld0*b*, mrglb, mrgrb, hdlb, den, eq, qen, and complementary data values d/db and q/qb.

Referring now to FIG. 5 in conjunction with FIG. 6A a "read only" operation will now be described. A read only operation can read data stored in a latch. Such an operation can occur after data has been programmed and loaded into volatile latch 502. For example, while an integrated circuit is in operation, it may be desirable to access nonvolatile data (as stored by anti-fuse devices) in a rapid fashion from volatile latch 502 or to read data subsequently written into such a latch.

As shown in FIG. 6A, in a read only operation, a program power supply voltage Vpp can be at a high power supply level Vpwr. Signals vblk1 and vblk2 can also be at a high level to turn off data load paths in each programmable data circuit (516-0/1 and 556-0/1). Signals lprg0 and lprg1 can be low, turning off program paths in each programmable data circuit (514-0/1 and 554-0/1). Similarly, signals ld1*b* and ld0*b* can be high, turning off data load paths in each programmable data circuit (516-0/1 and 556-0/1).

In this way, anti-fuse devices (518-0/1 and 558-0/1) can be isolated from volatile latch 502 in a read only operation.

Bias voltages vmrg1 and vmrg2 can be at some bias levels, but because BIST circuit 580 is not active in a read only mode, such signals are shown with hatching. Signals mrglb and mrgrb can be high, isolating BIST current sources from nodes ND0 and ND1.

Within volatile latch 502, signal hldb can be low, enabling a latching function of the circuit. Signal den can be low, isolating a separate read/write path to be described later. An equalization signal eq can be low allowing data nodes ND0 and ND1 to be driven to complementary values.

As shown at time t0, in a read only operation, read only signal qen can go high, enabling pull-down transistors N5 and N7. Thus, if node ND0 is low and node ND1 is high, transistors N6 and N7 will pull data output qb to a low level. Transistor N4 can remain off, and data output q can remain high (assuming it was precharged or weakly pulled high). If node ND0 is high and node ND1 is low, transistor N4 will be turned on, and output q can be pulled low by transistor N4 and N5. Transistor N6 can remain off, and data output qb can remain high (assuming it was precharged or weakly pulled high).

In this way, data can be read from a volatile latch 502.

A "read for configure or test" (referred to hereinafter as read cfg) operation will now be described. Such a read cfg operation can read data stored in a latch by way of different outputs d/db for other purposes, such as checking data stored prior to configuring (e.g., programming the circuit), or when testing the circuit.

In the read cfg operation, supply Vpp and signals vblk1, vblk2, lprg0, lprg1 can have the same levels as the read only operation. Bias voltages vmrg1 and vmrg2 and signals mrglb and mrgrb can also have the same levels.

Within volatile latch 502, signals hldb, and eq can have the same levels as in the read only operation. In addition, signal qen can be low, turning off both pull-down devices N5/N7.

As shown at time t1, in the read cfg operation, access signal den can go high, enabling access transistors N8 and N9. As a result, node ND0 can be coupled to data input/output (I/O) db, and node ND1 can be coupled to data I/O d.

In this way, data can be read from a volatile latch 502 for additional operations, such as configuration and/or test.

A "write" operation will now be described. A write operation can write a data value into a volatile latch 502. Such a value can be subsequently read, or can be used to program an anti-fuse device in a program operation.

In a write operation, supply Vpp and signals vblk1, vblk2, lprg0, lprg1 can have the same levels as the read only operation. Bias voltages vmrg1 and vmrg2 and signals mrglb and mrgrb can have the same levels. Within volatile latch 502, signal qen can be low.

A write operation may be done with exactly the same signal states as a read operation, so long as the buffer driving signals d/db is of sufficiently low impedance so as to overcome the state stored in latch 502.

Alternatively, a write operation can have two phases: a latch precondition phase and a latch capture phase.

As shown at time t2, in a precondition phase signal hdlb can go high, turning off transistors P2/P3 and disabling the latching function of volatile latch 502. An equalization signal eq can then go high, turning on transistors N2/N3 and equalizing nodes ND0 and ND1 to a low power supply potential Vgnd. Signal eq can then return high, releasing volatile latch 502 from the equalization state.

As shown at time t3, in a latch phase write data can be driven on data I/Os d and db (as complementary values). Subsequently, access signal den can go high, connecting the complementary write data values to node ND0 and ND1. Signal hldb can then go low, enabling the latch operation of volatile latch 502, which can latch the write data value.

Referring to FIG. 5 in conjunction with FIG. 6B, a program operation will now be described. A program operation can program an anti-fuse device according to a data value stored within volatile latch 502. Such a value can have been previously written into the volatile latch 502 with a write operation.

As shown in FIG. 6B, in a program operation, a power supply voltage Vpp and signals vblk1 and vblk2 can initially be at a high power supply level Vpwr.

Signals ld1b and ld0b can be high, turning off data load paths in each programmable data circuit (516-0/1 and 556-0/1).

Bias voltages vmrg1 and vmrg2 and signals mrglb and mrgrb can have the same levels as the read operations (i.e., BIST circuit 580 disabled).

Within a volatile latch 502, signal hldb can be low, signal den can be low, signal eq can be low, and signal qen can be low. In this state, volatile latch 502 can store a data value to be programmed. In the particular example of FIG. 5, if a data value "0" is to be programmed, node ND0 can be high and node ND1 can be low, and either of anti-fuse devices 518-0 or 558-0 can be programmed. Conversely, if a data value "1" is to be programmed, node ND0 can be low and node ND1 can be high, and either of anti-fuse devices 518-1 or 558-1 can be programmed.

One of signals lprg0 and lprg1 can be active (high) depending upon which anti-fuse device set is being programmed. In particular, if one of the main anti-fuse devices (518-0/1) is to be programmed, signal lgpr0 can be active. If one of the redundant anti-fuse devices (558-0/1) is to be programmed, signal lgpr1 can be active.

As shown after time t4, with one of signals lprg0 or lprg1 high, both a power supply voltage Vpp and signals vblk1 and vblk2 can be pulsed with one or more pulses to a program voltage higher than a power supply voltage Vpwr. This can program a selected anti-fuse device based on a data value stored in volatile latch 502. In particular, if volatile latch 502 stores a "1", anti-fuse device 518-1 can be programmed by signal lprg0, while anti-fuse device 558-1 can be programmed by signal lprg1. If volatile latch 502 stores a "0", anti-fuse device 518-0 can be programmed by signal lprg0, while anti-fuse device 558-0 can be programmed by signal lprg1.

In this way, a programmable latch circuit 500 can be programmed.

A data load operation will now be described with reference to FIGS. 5 and 6B. The data load operation of FIG. 6B includes three phases: precondition, load and latch. As shown at time t5, a precondition phase can be the same as the precondition phase of a write operation.

As shown at time t6, in a load phase, signals vblk1, vblk2 can be low. Signal ld0b can be low to load data from main anti-fuse devices (518-0 and 518-1) and/or signal ld1b can be low to load data from redundant anti-fuse devices (558-0 and 558-1). In this way, a load path can be enabled, connecting one of nodes ND0 or ND1 to a programmed anti-fuse device, resulting in such a node being pulled higher in potential than the other node.

As shown at time t7, a latch phase can be the same as the latch phase of a write operation, only instead of latching a data value received via I/Os d/db, volatile latch 502 can latch a data value established by a programmed anti-fuse device.

A BIST operation will now be described with reference to FIGS. 5 and 6B.

The BIST operation of FIG. 6B can include four phases: precondition, evaluation, latch, and read. As shown at time t8, a precondition phase can be the same as the precondition phase of a write operation.

As shown at time t9, in an evaluation phase, signals vblk1, vblk2 can transition low. In addition, signal ld0b can be low to test one of the main anti-fuse devices (518-0 and 518-1) and signal ld1b can be low to test one of the redundant anti-fuse devices (558-0 and 558-1).

Bias voltages vmrg1 and vmrg2 can be at a level that generates a desired current draw by BIST circuit 580. In addition, one of test signals mrglb or mrgrb can be active (low in this example), according to which "side" of the latch circuit is to be tested. In particular, to test either of anti-fuse devices 518-1 or 558-1, signal mrglb can be active. To test either of anti-fuse devices 518-0 or 558-0, signal mrgrb can be active.

In this way, in an evaluate phase, a selected anti-fuse device can provide current to one node of volatile latch 502, while BIST circuit 580 can provide current to the other node of volatile latch 502.

As shown at time t10, a latch phase can be the same as the latch phase of a write operation. However, instead of latching a data value received via I/Os d/db, volatile latch 502 can latch a data value established by a relative difference in current drawn by BIST circuit 580 at one node (ND0 or ND1) and current drawn by a programmed anti-fuse device under test at the other node (ND1 or ND0).

As shown at time t11, a read phase can be the same as a read cfg operation, like that shown in FIG. 6A.

In this way, a programmable latch circuit can have built-in self-test capabilities.

Figure 7:
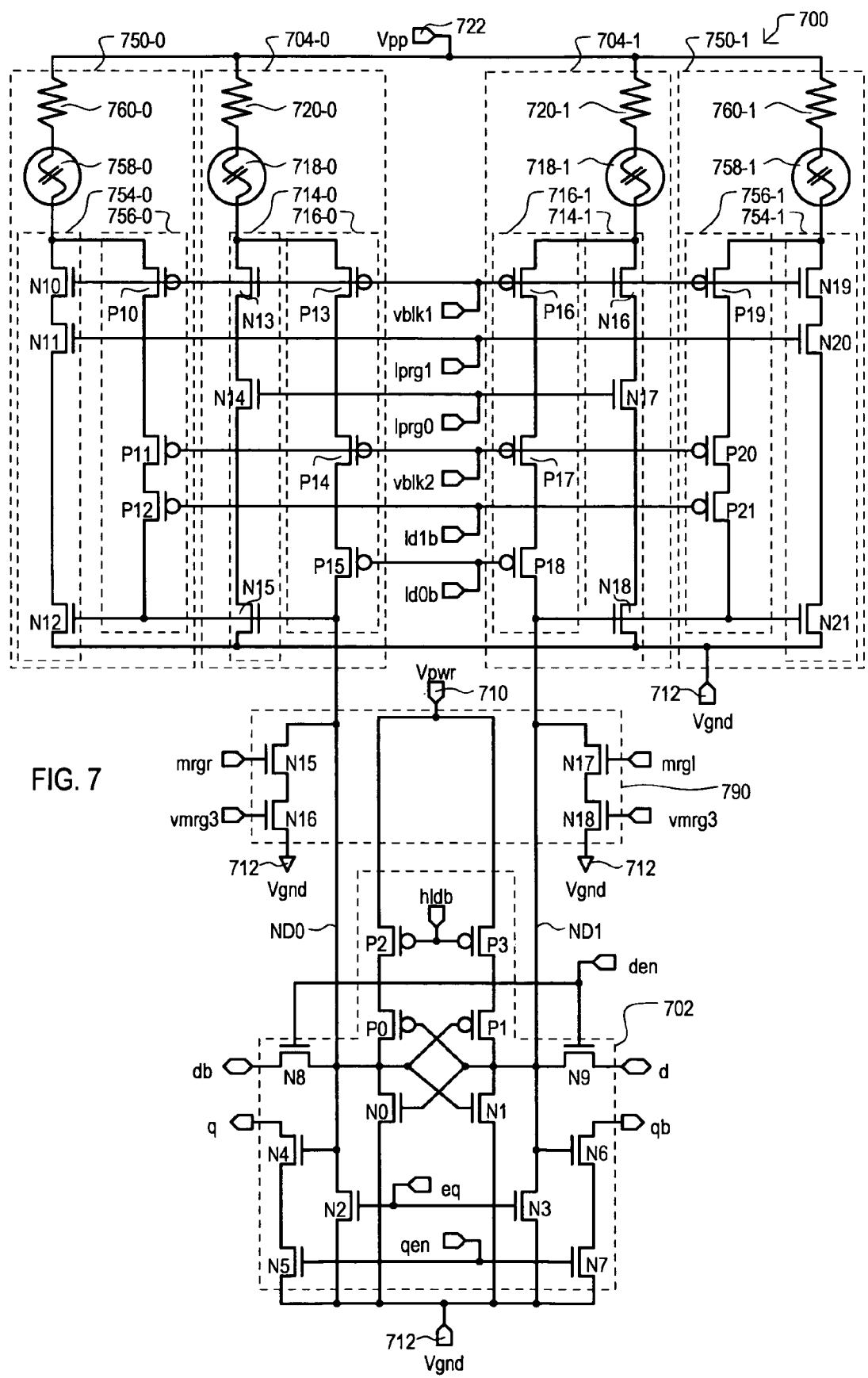
FIG. 7 is a schematic diagram of a programmable latch circuit according to a sixth embodiment of the present invention.

Referring now to FIG. 7, a programmable latch circuit 700 according to a sixth embodiment of the present invention is set forth in a detailed schematic diagram. A programmable latch circuit 700 can include some of the same general components as that of FIG. 5. Thus, like components will be referred to by the same reference character but with the first digit being a "7" instead of a "5".

Programmable latch circuit 700 can differ from that of FIG. 5 in that it can include a BIST circuit 790 that includes NMOS transistors.

A BIST circuit 790 can include NMOS transistors N15-N16 for testing anti-fuse devices 718-0 and/or 758-0, and NMOS transistors N17-N18 for testing anti-fuse devices 718-1 and/or 758-1. Transistors N15-N16 can have source-drain paths arranged in series between data node ND0 and a low supply node 712. Transistors N17-N18 can have source-drain paths arranged in series between data node ND1 and a low supply node 712. Transistors N16 and N18 can receive a bias voltage vmrg3. Transistors N15 and N17 can receive a test enable signal mrgl and mrgr, respectively. Bias voltage vmrg3 can be set to a level to "margin" test programmed anti-fuse devices, as described above.

In a BIST operation of FIG. 7, a volatile latch circuit 702 can latch a data value established by a relative difference in current sunk by BIST circuit 790 and current sourced by a programmed anti-fuse device under test.

According to another embodiment, a programmable latch circuit 500 like that of FIG. 5 may not include redundancy. In such a case, redundant programmable data circuits 550-0 and 550-1 would be omitted, and signals lprg1 and ld1b would not be needed.

According to still another embodiment, a programmable latch circuit 500 like that of FIG. 5 may enable all program paths, both main and redundant with one signal. In such a case, signals lprg0 and lprg1 would be the same signal. It would remain preferable to maintain separate signals ld0b and ld1b in order to provide for separate testing of redundant and main anti-fuse devices.

According to still another embodiment, a programmable latch circuit 500 like that of FIG. 5 may not include BIST capabilities. In such a case, the circuit would not include a BIST circuit 580.

Figure 8:
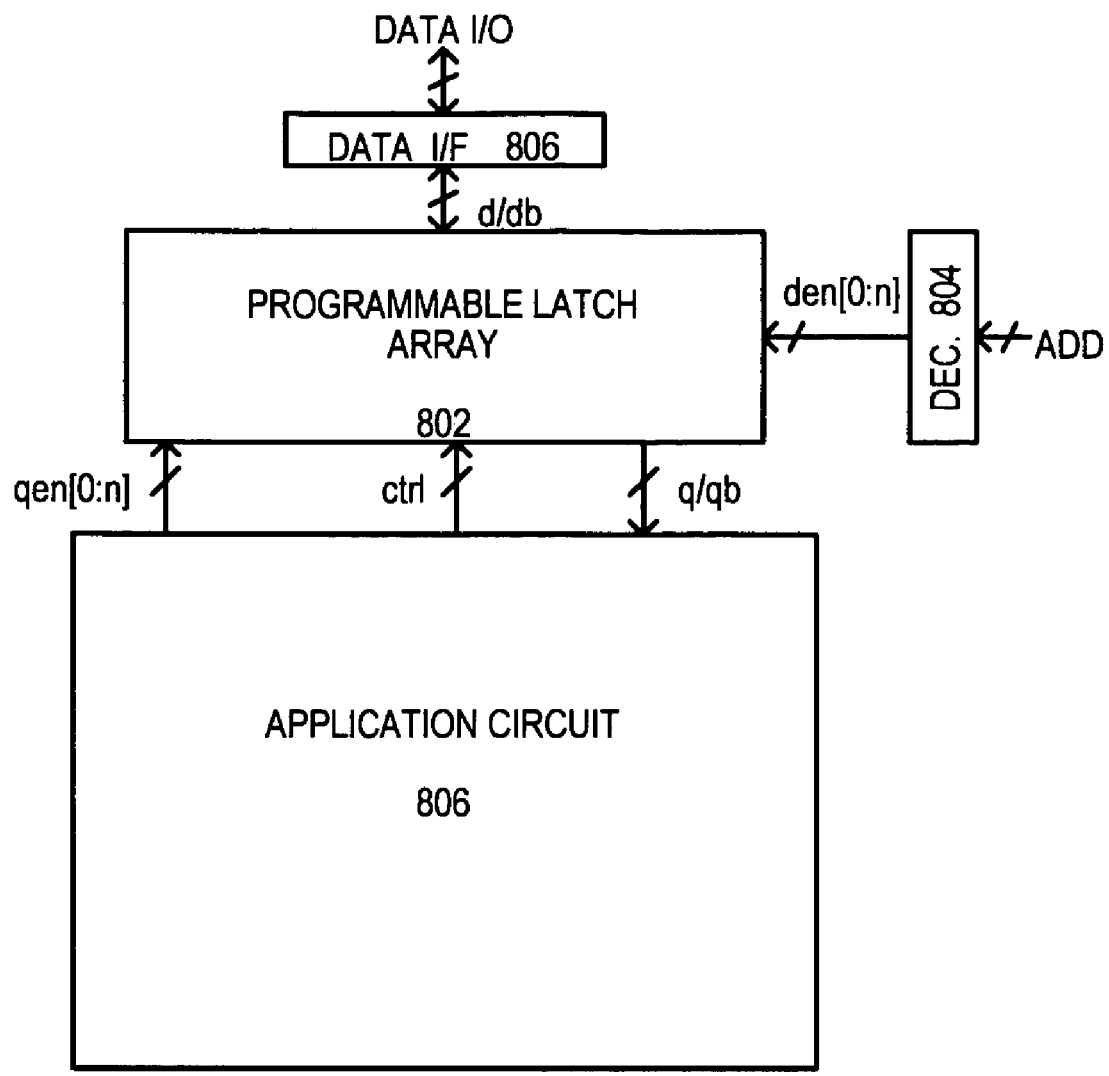
FIG. 8 is a block schematic diagram of an integrated circuit device according to an embodiment of the present invention.
Figure 9:
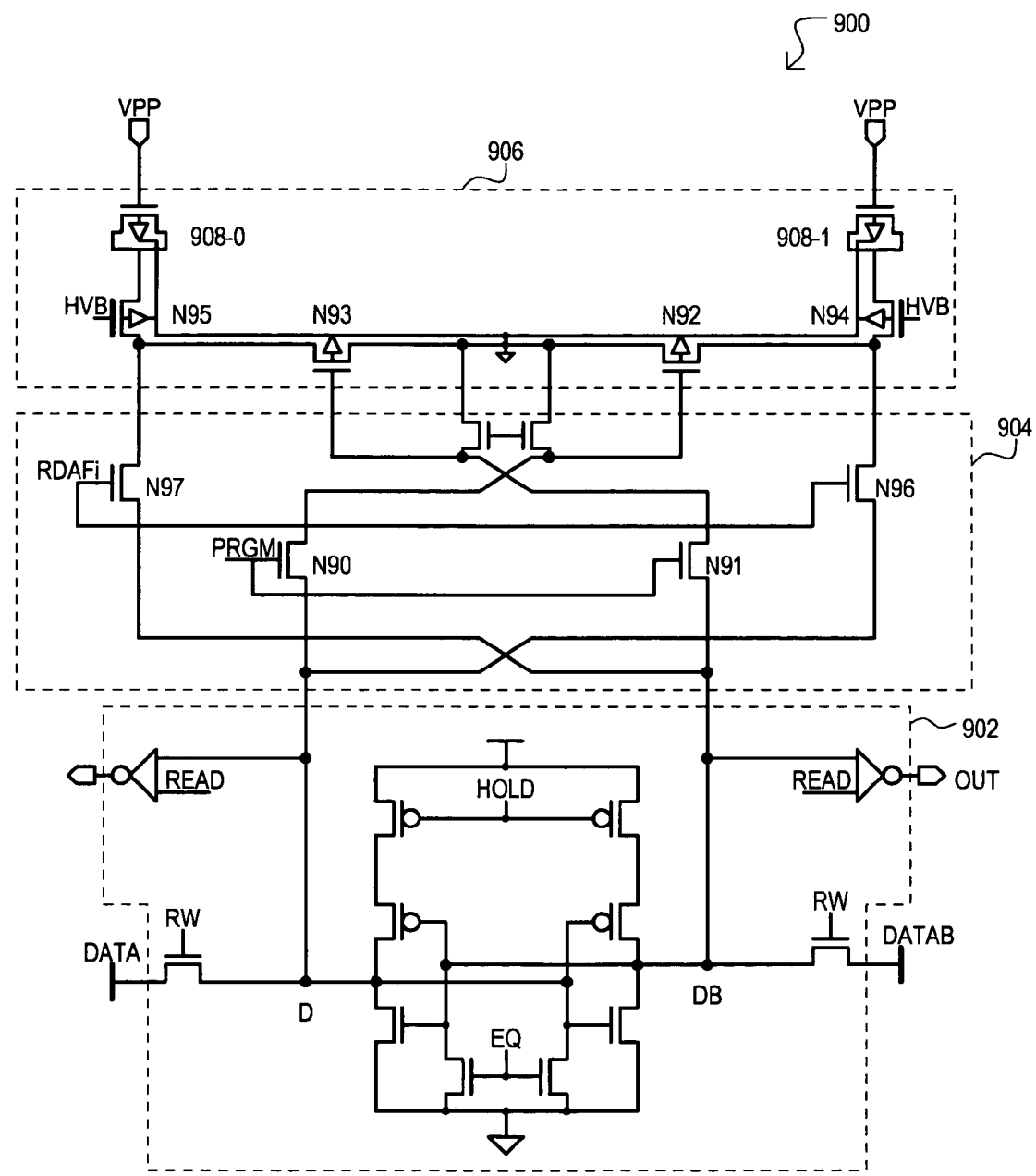
FIG. 9 is a schematic diagram of a conventional one-time programmable latch circuit.

FIG. 8 shows an integrated circuit device according to an embodiment of the present invention. In FIG. 8, an integrated circuit 800 can include a programmable latch array 802, a decoder 804, a data interface 806, and an application circuit 808. A programmable latch array 802 can include an array of programmable latch circuits, each of which can take the form of any of the above embodiments. Programmable latch circuits within array 802 can be accessed according to read only signals qen[0:n] and access signals den[0:n]. It is noted that such signals can access programmable latch circuits on a one-by-one basis, or in logical groups (e.g., byte, word, etc.).

A decoder 804 can receive address values, and decode such values to generate access signals den[0:n].

A data interface 806 can provide read and write paths to and from programmable latch array 806. It is noted that in the embodiment shown, data interface 806 can work in conjunction with decoder 804. That is, read data can be output via data interface 806 in response to address signals decoded by decoder 804. In addition, write data received via data interface 806 can be written into locations of array 802 indicated by address signals received by decoder 804.

An application circuit 806 can receive data (q/qb) stored in array 802 by generating read only and control signals (qen[0:n] and ctrl). As but one example, an application circuit 806 can receive configuration information stored in a nonvolatile fashion within array 802 in order to provide a given functionality. Even more particularly, upon power-on or reset, nonvolatile data stored in anti-fuse devices can be automatically loaded into volatile latches, and then output as read only data to application circuit 806.

It is understood that the embodiments of the invention may be practiced in the absence of an element and or step not specifically disclosed. That is, an inventive feature of the invention can be elimination of an element or step.

It should be appreciated that reference throughout this specification to "one embodiment" or "an embodiment" means that a particular feature, structure or characteristic is described in connection with the embodiment is included in at least one embodiment of the present invention. Therefore, it is emphasized that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the present invention.

Similarly, while the various aspects of the particular embodiments set forth herein have been described in detail, the present invention could be subject to various changes, substitutions, and alterations without departing from the spirit and scope of the invention.

What is claimed is:

1. A programmable latch circuit, comprising:
   at least one anti-fuse device that provides a first impedance in an unprogrammed state and a second impedance in a programmed state, the second impedance being less than the first impedance;
   at least one program path coupled between a node of a volatile latch circuit and the at least one anti-fuse device that is enabled in a program operation that establishes a state of the anti-fuse device; and
   at least one data load path coupled between the node of the volatile latch circuit and the anti-fuse device in parallel with the at least one program path, the at least one data load path comprising a source-drain path of at least one p-channel insulated gate field effect transistor (IGFET).

2. The programmable latch circuit of claim 1, further including:
   a resistor formed in the same substrate as the anti-fuse device coupled between the anti-fuse device and a program voltage node.

3. The programmable latch circuit of claim 1, wherein:
   the at least one anti-fuse device includes at least a first primary anti-fuse device and a first redundant anti-fuse device;
   the at least one program path includes
      a first primary program path coupled between a first node of the volatile latch circuit and the first primary anti-fuse device, and
      a first redundant program path coupled between the first node of the volatile latch circuit and the first redundant anti-fuse device; and
   the at least one data load path includes
      a first primary data load path coupled between the first node of the volatile latch circuit and the first primary anti-fuse device, and
      a first redundant data load path coupled between the first node of the volatile latch circuit and the first redundant anti-fuse device.

4. The programmable latch circuit of claim 3, wherein:
   the at least one anti-fuse device further includes a second primary anti-fuse device and a second redundant anti-fuse device;
   the at least one program path further includes
      a second primary program path coupled between a second node of the volatile latch circuit and the second primary anti-fuse device, and
      a second redundant program path coupled between the second node of the volatile latch circuit and the second redundant anti-fuse device; and
   at least one data load path further includes
      a second primary data load path coupled between the second node of the volatile latch circuit and the second primary anti-fuse device, and
      a second redundant data load path coupled between the second node of the volatile latch circuit and the second redundant anti-fuse device.

5. The programmable latch circuit of claim 1, wherein:
   the at least one data load path consists of a plurality of p-channel IGFETs having source-drain paths arranged in series between the node of the volatile latch circuit and the anti-fuse device.

6. The programmable latch circuit of claim 1, wherein:
   the at least one program path consists of a plurality of n-channel IGFETs having source-drain paths arranged in series between the node of the volatile latch circuit and the anti-fuse device.

7. The programmable latch circuit of claim 1, further including:
   the at least one program path is coupled to a first node of the volatile latch circuit;
   the at least one data load path is coupled to the first node of the volatile latch; and
   an anti-fuse test circuit coupled between the first node of the volatile latch and a power supply node, the anti-fuse test circuit including a current supply arranged in series with a controllable impedance path.

8. The programmable latch circuit of claim 7, wherein:
   the current supply comprises an IGFET that receives a bias voltage at its gate, the bias voltage varying between a high power supply level and a low power supply level.

9. A programmable latch circuit, comprising:
   a volatile latch circuit comprising a pair of latch transistors cross-coupled between a first data node and a second data node and formed in an integrated circuit substrate;

at least one anti-fuse structure coupled to at least one of
the data nodes; and
a self-test circuit formed in the integrated circuit substrate
including a first self-test section coupled to at least one
of the data nodes that includes a first current source
circuit and a first switch device arranged in series, the
first switch device providing a low impedance in a test
mode and a high impedance in a non-test mode.

10. The programmable latch circuit of claim 9, wherein:
the at least one anti-fuse structure includes at least a first
primary anti-fuse structure coupled to the first data
node and at least a second primary anti-fuse structure
coupled to the second data node; and
the self-test circuit further includes
the first self-test section coupled the first data node and
the first switch device providing the low impedance
in a first test mode, and
a second self-test circuit coupled to the second data
node that includes a second current source circuit
and a second switch device arranged in series, the
second switch device providing a low impedance in
a second test mode and a high impedance in the
non-test mode.

11. The programmable latch circuit of claim 9, wherein:
the at least one anti-fuse structure includes
a first primary anti-fuse structure and a first redundant
anti-fuse structure coupled to a first data node of the
volatile latch circuit, and
a second primary anti-fuse structure and a second
redundant anti-fuse structure coupled to a second
data node of the volatile latch circuit.

12. The programmable latch circuit of claim 9, wherein:
the at least one anti-fuse structure includes at least a first
primary anti-fuse structure coupled between the first
data node and a high power supply node; and
the self-test circuit includes the first self-test section
coupled between a second data node and the high
power supply node, and the first switch device is a
p-channel insulated gate field effect transistor.

13. The programmable latch circuit of claim 12, wherein:
the at least one anti-fuse structure further includes a
second primary anti-fuse structure coupled between the
second data node and the high power supply node; and
the self-test circuit further includes a second self-test
section coupled between the first data node and the high
power supply node that includes a second current
source circuit and a second switch device arranged in
series, the second switch device comprising a p-chan-
nel insulated gate field effect transistor that provides a
low impedance in a test mode and a high impedance in
a non-test mode.

14. The programmable latch circuit of claim 9, further
including:
at least a first resistor formed in the integrated circuit
substrate and coupled between the at least one anti-fuse
structure and a first power supply node.

15. The programmable latch circuit of claim 9, further
including:
the pair of latch transistors having sources coupled to a
low power supply voltage and having a first threshold
voltage; and
at least a first data path comprising
a first data program path coupled between the at least one
anti-fuse structure and at least one data node that is
enabled to program the first primary anti-fuse structure
into a low impedance state, and
a first data load path coupled between the at least one
anti-fuse structure and the at least one data node that is
enabled to read a state of the first primary anti-fuse
structure, the first data load path consisting of load
transistors having a threshold voltage that is less than
the first threshold voltage.

16. The programmable latch circuit of claim 15, wherein:
the load transistors are selected from the group consisting
of p-channel insulated gate field effect transistors (IG-
FETs) and native n-channel IGFETs having threshold
voltages with an absolute value no greater than 200 mV.

17. A method of programmable latching, comprising the
steps of:
programming at least one anti-fuse device into a prede-
termined state by applying a programming voltage to a
program path coupled to the anti-fuse device; and
loading a data value into a volatile latch circuit by
enabling a data load path, different from the program
path, coupled between the at least one anti-fuse device
and the volatile latch circuit, the data value being
determined by the state of the at least one anti-fuse
device.

18. The method of programmable latching of claim 17,
wherein:
enabling the data path includes enabling a plurality of
p-channel insulated gate field transistors having source-
drain paths that form at least a portion of the data path.

19. The method of programmable latching of claim 17,
further including:
providing a resistor, formed in the same integrated circuit
as the volatile latch circuit, between the at least one
anti-fuse device and a programming power supply
node; and
in a test mode, latching a data value in the volatile latch
circuit based on a comparison between a current drawn
by the at least one anti-fuse device and a current drawn
by a current source circuit formed in the same substrate
as the volatile latch circuit.

20. The method of programmable latching of claim 17,
further including:
providing first and second anti-fuse devices in parallel
between a first node of the volatile latch circuit and a
programming voltage node;
providing third and fourth anti-fuse devices in parallel
between a second node of the volatile latch circuit and
the programming voltage node;
providing both a programming path and data load path
between each anti-fuse device and the node of the
volatile latch to which the anti-fuse device is coupled;
programming the second anti-fuse device if a program-
ming of the first anti-fuse is not successful; and
programming the fourth anti-fuse device if a program-
ming of the third anti-fuse is not successful.

* * * * *

UNITED STATES PATENT AND TRADEMARK OFFICE
CERTIFICATE OF CORRECTION

PATENT NO. : 7,339,848 B1  Page 1 of 1
APPLICATION NO. : 11/343341
DATED : March 4, 2008
INVENTOR(S) : Galen Stansell et al.

It is certified that error appears in the above-identified patent and that said Letters Patent is hereby corrected as shown below:

IN THE SPECIFICATION

At column 7, line 40, please replace "2451" with -- 254-1 -- so that the corresponding phrase reads – (214-0, 214-1, 254-0 and 254-1) –.

Starting at column 7, line 43, please replace "(2140/1, 2540/1)" with -- (214-0/1, 254-0/1) -- so that the corresponding phrase reads – A program path (214-0/1, 254-0/1) can provide a low impedance –.

At column 7, line 64, please replace "2040" with -- 204-0 -- so that the corresponding phrase reads – data circuit 204-0 between –.

At column 9, line 25, please replace "5040" with -- 504-0 -- so that the corresponding phrase reads – data circuits 504-0 and 504-1 –.

At column 9, line 65, please replace "5040" with -- 504-0 -- so that the corresponding phrase reads – (504-0, 504-1, 550-0, 550-1) –.

At column 10, line 2, please replace "5140" with -- 514-0 -- so that the corresponding phrase reads – program path 514-0 –.

Signed and Sealed this

First Day of July, 2008

JON W. DUDAS
*Director of the United States Patent and Trademark Office*